(12) United States Patent
Butler et al.

(10) Patent No.: US 7,352,149 B2
(45) Date of Patent: Apr. 1, 2008

(54) METHOD FOR CONTROLLING THE POSITION OF A MOVABLE OBJECT, A POSITIONING SYSTEM, AND A LITHOGRAPHIC APPARATUS

(75) Inventors: Hans Butler, Best (NL); Franciscus Adrianus Gerardus Klaassen, Best (NL)

(73) Assignee: ASML Netherlands B.V., Veldhoven (NL)

( * ) Notice: Subject to any disclaimer, the term of this patent is extended or adjusted under 35 U.S.C. 154(b) by 35 days.

(21) Appl. No.: 11/511,492

(22) Filed: Aug. 29, 2006

(65) Prior Publication Data

US 2008/0054838 A1 Mar. 6, 2008

(51) Int. Cl.
*B64C 17/08* (2006.01)

(52) U.S. Cl. ............. 318/649; 318/135; 318/432; 355/53; 355/72; 310/12; 361/139

(58) Field of Classification Search ............ 318/649
See application file for complete search history.

(56) References Cited

U.S. PATENT DOCUMENTS

| | | | | |
|---|---|---|---|---|
| 5,528,118 A | * | 6/1996 | Lee | 318/568.17 |
| 5,623,853 A | * | 4/1997 | Novak et al. | 74/490.09 |
| 6,069,417 A | * | 5/2000 | Yuan et al. | 310/12 |
| 6,989,887 B2 | * | 1/2006 | Poon et al. | 355/72 |
| 7,113,256 B2 | * | 9/2006 | Butler et al. | 355/53 |
| 7,126,674 B2 | * | 10/2006 | Butler | 355/72 |
| 7,170,581 B2 | * | 1/2007 | Tousain | 355/53 |
| 2003/0184254 A1 | * | 10/2003 | Ebihara et al. | 318/649 |
| 2005/0128160 A1 | * | 6/2005 | Van Den Biggelaar et al. | 355/72 |
| 2005/0162802 A1 | * | 7/2005 | Kho et al. | 361/139 |
| 2005/0231706 A1 | * | 10/2005 | Yang et al. | 355/72 |
| 2006/0061218 A1 | * | 3/2006 | Hazelton | 310/12 |

* cited by examiner

*Primary Examiner*—Lincoln Donovan
*Assistant Examiner*—Michael Brandt
(74) *Attorney, Agent, or Firm*—Pillsbury Winthrop Shaw Pittman LLP

(57) ABSTRACT

A method of actuating a movable object in a first degree of freedom includes a) providing a first motor assembly including one or more motors of a first type and a second motor assembly including one or more motors of a second type, each of the first and second motor assembles being configured to move the movable object in the first degree of freedom, b) feeding the first motor assembly with a feed-forward signal of a feed-forward unit on the basis of a feed-forward reference signal, and c) feeding the second motor assembly with a control signal of a position control unit on the basis of a position control reference signal.

18 Claims, 3 Drawing Sheets

METHOD FOR CONTROLLING THE POSITION OF A MOVABLE OBJECT, A POSITIONING SYSTEM, AND A LITHOGRAPHIC APPARATUS

FIELD

The present invention relates to a method for controlling the position of a movable object and a positioning system for a lithographic apparatus. More particularly, the present invention relates to a method and a positioning system for controlling a short stroke module of a substrate stage or reticle stage of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"—direction) while synchronously scanning the substrate parallel or anti-parallel to this direction. It is also possible to transfer the pattern from the patterning device to the substrate by imprinting the pattern onto the substrate.

The known lithographic apparatus includes a number of movable objects, which have to be actuated with relatively large accelerations and high accuracy. An example of such moveable object is a wafer stage, which supports a wafer during the projection process. Such wafer stage may include a long stroke module and a short stroke module. The long stroke module supports the short stroke module, while the short stroke module is configured to carry the wafer. The long stroke module is used for coarse positioning of the wafer stage, while the short stroke module is used for fine positioning of the wafer with respect to the projection system. In the known lithographic apparatus, a Lorentz motor is used for the actuation of the short stroke module. Such Lorentz motor is known to be a very accurate motor with which the short stroke module can be placed with high accuracy in the correct position. However, Lorentz motors are not highly efficient and a relatively large amount of heat is dissipated during the use of the motor. Such dissipation of heat is in generally undesirable, in particular when large forces have to be produced by the motor during acceleration of the short stroke module. The generated heat may have a negative influence on the control accuracy of the Lorentz motor and on the performance of other systems in the lithographic apparatus.

It has been proposed to provide two types of motors for the actuator arrangement of the short stroke module, one type having a high efficiency but being relatively inaccurate, the other type being highly accurate, but having a low efficiency. For instance, US 2006/0061218 A1 proposes an actuator arrangement including two types of motor for the position control of a short stroke module. In this actuator arrangement the use of E-I actuators is proposed to generate acceleration and deceleration forces to bring the short stroke module in the vicinity of a desired position. When the short stroke module is brought in the vicinity of the desired position, the control is taken over by a voice coil motor which is used to generate acceleration and deceleration forces to precisely control the position of the short stroke module. Thus, for the short stroke module there is carried out a coarse positioning phase in which the short stroke module is actuated by a first type of motor and a fine control phase in which the short stroke module is actuated by a second type of motor. Between these phases the two types of motors are switched off and on.

In particular during the fine positioning of the short stroke module, the E-I actuators have to be switched off to avoid that interaction between the control forces generated by the E-I actuators and the voice coil motor lead to settling phenomena, which would have a negative influence on the throughput and/or accuracy of the lithographic apparatus. However, the off and on switching of the different types of motors is undesirable as it makes control of the actuator arrangement more complex. Furthermore, the switching off and on of the different type of motors as such may be undesirable.

SUMMARY

It is desirable to provide an actuator arrangement for a movable object, in particular a short stroke module of a wafer stage or reticle stage, in which two types of motors are used for actuation of the same movable object and in which the on and off switching of motors is not required.

According to an embodiment of the invention, there is provided a method for positioning a movable object in a first degree of freedom, the method including providing a first motor assembly including one or more motors of a first type and a second motor assembly including one or more motors of a second type both the first and second motor assembly being configured to actuate the movable object in the first degree of freedom, feeding the first motor assembly with a feed-forward signal of a feed-forward unit on the basis of a feed-forward reference signal, and feeding the second motor assembly with a control signal of a control unit on the basis of a difference between a control reference signal and a signal representative for the actual position of the movable object.

According to an embodiment of the invention, there is provided a positioning system configured to control the position of a movable object in a first degree of freedom, including a first motor assembly including one or motors of a first type configured to actuate the movable object in the first degree of freedom, a second motor assembly including one or more motors of a second type configured to actuate the movable object in the same first degree of freedom, a feed-forward unit configured to provide a control signal to the first motor assembly on the basis of a feed-forward reference signal, and a feedback control unit configured to provide a control signal to the second motor assembly on the basis of a difference between a control reference signal and a signal representative for the actual position of the movable object.

According to an embodiment of the invention, there is provided a lithographic apparatus including an illumination system configured to condition a radiation beam; a reticle stage constructed to support a patterning device, the patterning device being capable of imparting the radiation beam with a pattern in its cross-section to form a patterned radiation beam; a substrate stage constructed to hold a substrate; and a projection system configured to project the patterned radiation beam onto a target portion of the substrate, wherein the substrate stage or reticle stage includes a long stroke module and a short stroke module, the short stroke module being configured to carry a substrate or patterning device, respectively, and being movably supported on the long stroke module, the lithographic apparatus further including a positioning system, the movable object being the short stroke module. The positioning system is configured to control the position of a movable object in a first degree of freedom, includes a first motor assembly including one or motors of a first type configured to actuate the movable object in the first degree of freedom, a second motor assembly including one or more motors of a second type configured to actuate the movable object in the same first degree of freedom, a feed-forward unit configured to provide a control signal to the first motor assembly on the basis of a feed-forward reference signal, and a feedback control unit configured to provide a control signal to the second motor assembly on the basis of a difference between a control reference signal and a signal representative for the actual position of the movable object.

In an embodiment, there is provided a positioning system configured to position a stage module in a lithographic apparatus, the stage module configured to hold one of a substrate or a patterning device in at least a first degree of freedom, the positioning system including (i) a first motor assembly including one or motors of a first type configured to move the stage module in the first degree of freedom; (ii) a second motor assembly including one or more motors of a second type configured to move the stage module in the first degree of freedom; (iii) a feed-forward unit configured to provide a control signal to the first motor assembly based on a feed-forward reference signal; and (iv) a feedback control unit configured to provide a control signal to the second motor assembly based on a difference between a control reference signal and a signal representative of a current position of the stage module.

In yet another embodiment of the invention, there is provided a method of positioning a movable object in a first degree of freedom, the method including: moving the movable object in the first degree of freedom with a first motor assembly including one or more motors of a first type; moving the movable object in the first degree of freedom with a second motor assembly including one or more motors of a second type; supplying a feed-forward signal outputted by a feed-forward unit to the first motor assembly, the feed-forward signal being based on a feed-forward reference signal that is inputted to the feedforward unit; and supplying a control signal outputted by a control unit to the second motor assembly, the control signal being based on a difference between a control reference signal and a signal representative of a current position of the movable object.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
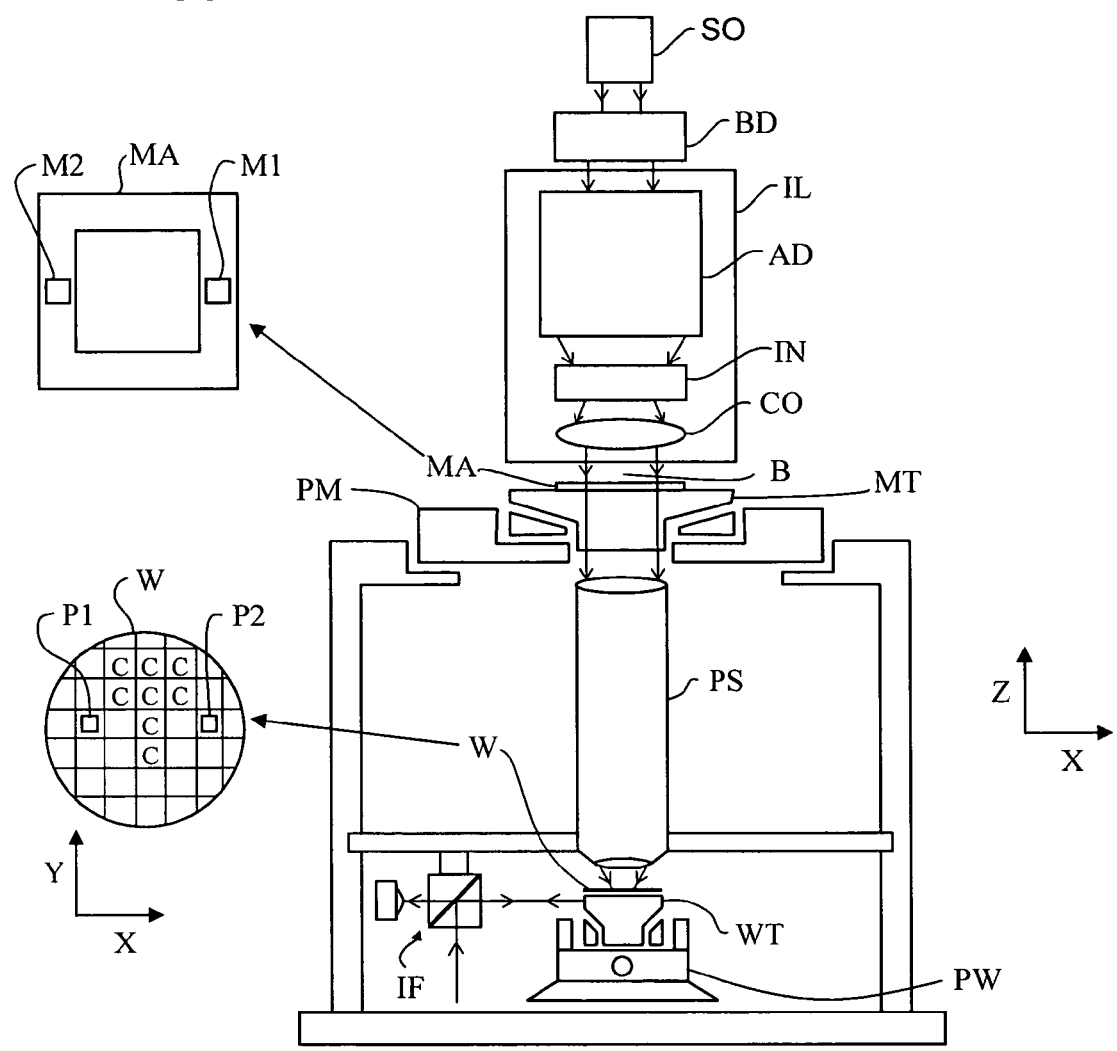
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or other radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
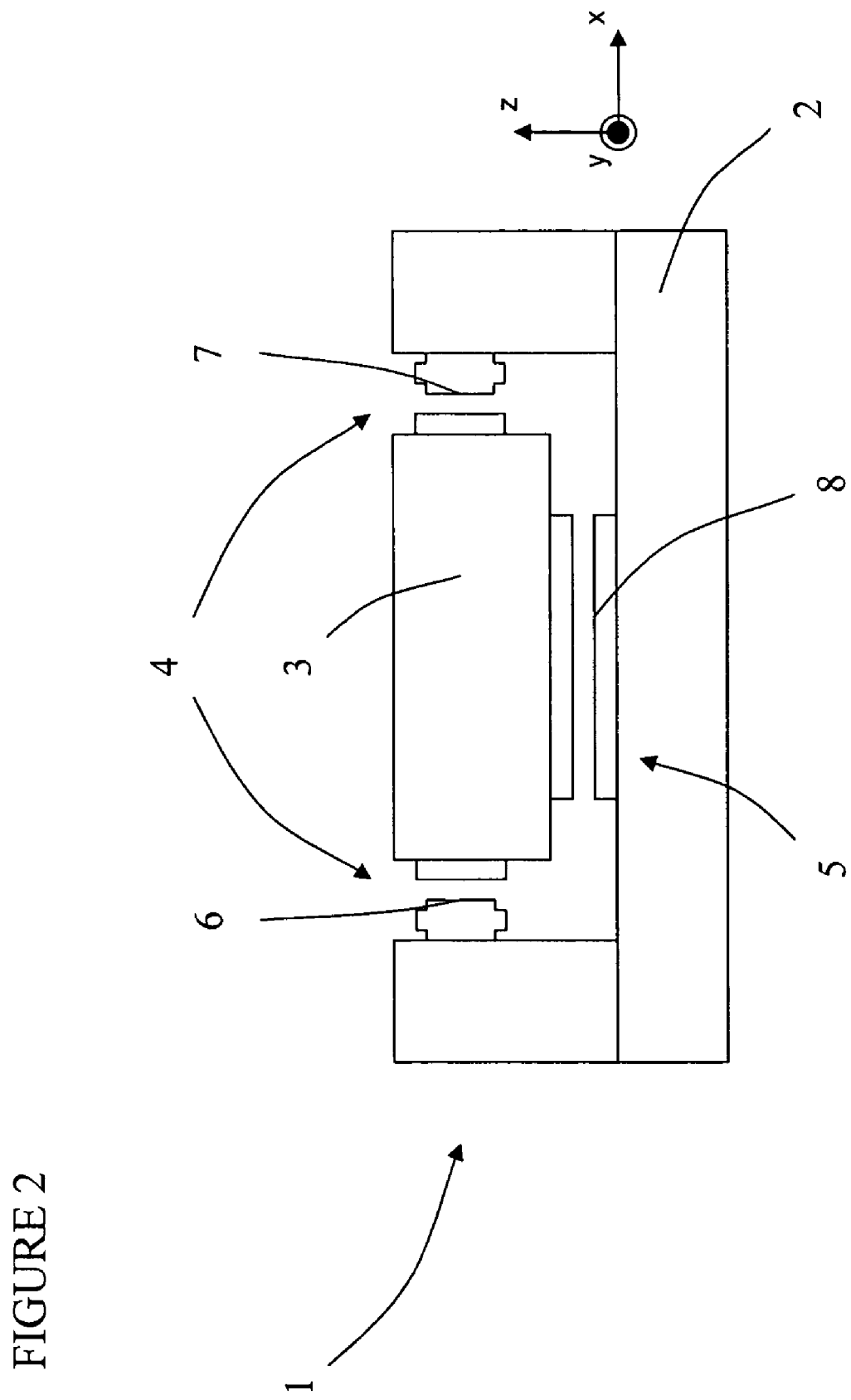
FIG. 2 depicts schematically a wafer stage including a positioning system according to an embodiment of the invention.

FIG. 2 shows a wafer stage and a positioning system according to an embodiment of the invention. The wafer stage is in general indicated with reference numeral 1, and includes a long stroke module 2 and a short stroke module 3. The long stroke module 2 is used for coarse positioning of a wafer which may be carried by the short stroke module 3. The short stroke module 3 is used for fine positioning of a wafer carried by it. The short stroke module 3 is movably supported by a support device on the long stroke module 2. The support device of the short stroke module 3 preferably does not have any (or has a very low) friction, and may for instance be an air bed. The long stroke module is movably supported by a frame and may be actuated by any suitable actuator, for instance a planar magnet motor, for coarse positioning of the long stroke module.

To actuate the short stroke module 3 in the x-direction, a combination of a first motor assembly 4 and a second motor assembly 5 is provided. The first motor assembly 4 includes two reluctance motors 6 and 7, which are arranged at opposite sides of the short stroke module 3. Such reluctance motor includes a coil which is preferably connected to the long stroke module 2 and a body of ferrous material, for instance an iron bar, preferably arranged on the short stroke module 3.

It is desirable to provide a reluctance motor 6, 7 at each side of the short stroke module as these reluctance motors 6, 7 can only be used to attract the short stroke module 3. Thus, with the reluctance motor 6, the short stroke module 3 can be moved to the left of the drawing, but in order to move the short stroke module 6 in the opposite direction, i.e. in the drawing to the right, the reluctance motor 7 at the opposed side of the short stroke module 3 has to be used.

The second motor assembly 5 includes a Lorentz motor 8 which is arranged at the underside of the short stroke module 3. Such Lorentz motor includes a coil which is preferably arranged on the long stroke module 2 and a magnet which is arranged on the short stroke module 3.

Reluctance motors 6 and 7 are known to be highly efficient motors, which relatively do not generate much heat. These reluctance motors 6 and 7 are very useful for acceleration and deceleration of the short stroke module 3, as a low amount of heat is generated during the acceleration/deceleration of the short stroke module 3. However, the reluctance motors 6 and 7 have a relatively low accuracy, and are therefore not suitable for the fine positioning of the short stroke module 3.

Instead of reluctance motors 6 and 7, it will be appreciated that any other type of relative high efficient motors, such as E-I core actuators, may also be used in the first motor assembly 4.

The Lorentz motor 8 is relatively accurate in fine positioning the short stroke module 3. However, the Lorentz motor 8 has a relatively low efficiency, and therefore a considerable amount of heat is generated when the motor is used for accelerating/decelerating the short stroke module 3. Any other type of motor which makes a highly accurate positioning of the short stroke module 3 possible may also be used as a motor of the second motor assembly 5. For instance, voice coil motors or other linear motors may be suitable.

By using a combination of first a motor assembly including one or more motors of a first type having a high efficiency, but relatively low accuracy, and a second motor assembly including one or more motors of a second type having a low efficiency and high accuracy, to actuate the short stroke module 3 in a degree of freedom, the benefits of each type of the motors of the first and second motor assemblies can be used in the actuation of the short stroke module 3.

In an embodiment of a known lithographic apparatus a combination of a first motor assembly and a second motor assembly having motors of a different type is known from US 2006/0061218, the contents of which is herein incorporated by reference. In this embodiment the first motor assembly is, in a first step to control the position of a short stroke module, used to accelerate the short stroke module 3 in the direction of the desired position or in the vicinity of a desired speed. When the short stroke module 3 comes in the vicinity of the desired position or speed, the actuation of the short stroke module is taken over by the second motor assembly with which the short stroke module may be brought accurately in the desired position or held at the desired speed. During the fine positioning of the short stroke module 3, the first motor assembly is switched off to avoid any interference of the motor or motors of the first motor assembly in the fine positioning of the short stroke module 3.

Figure 3:
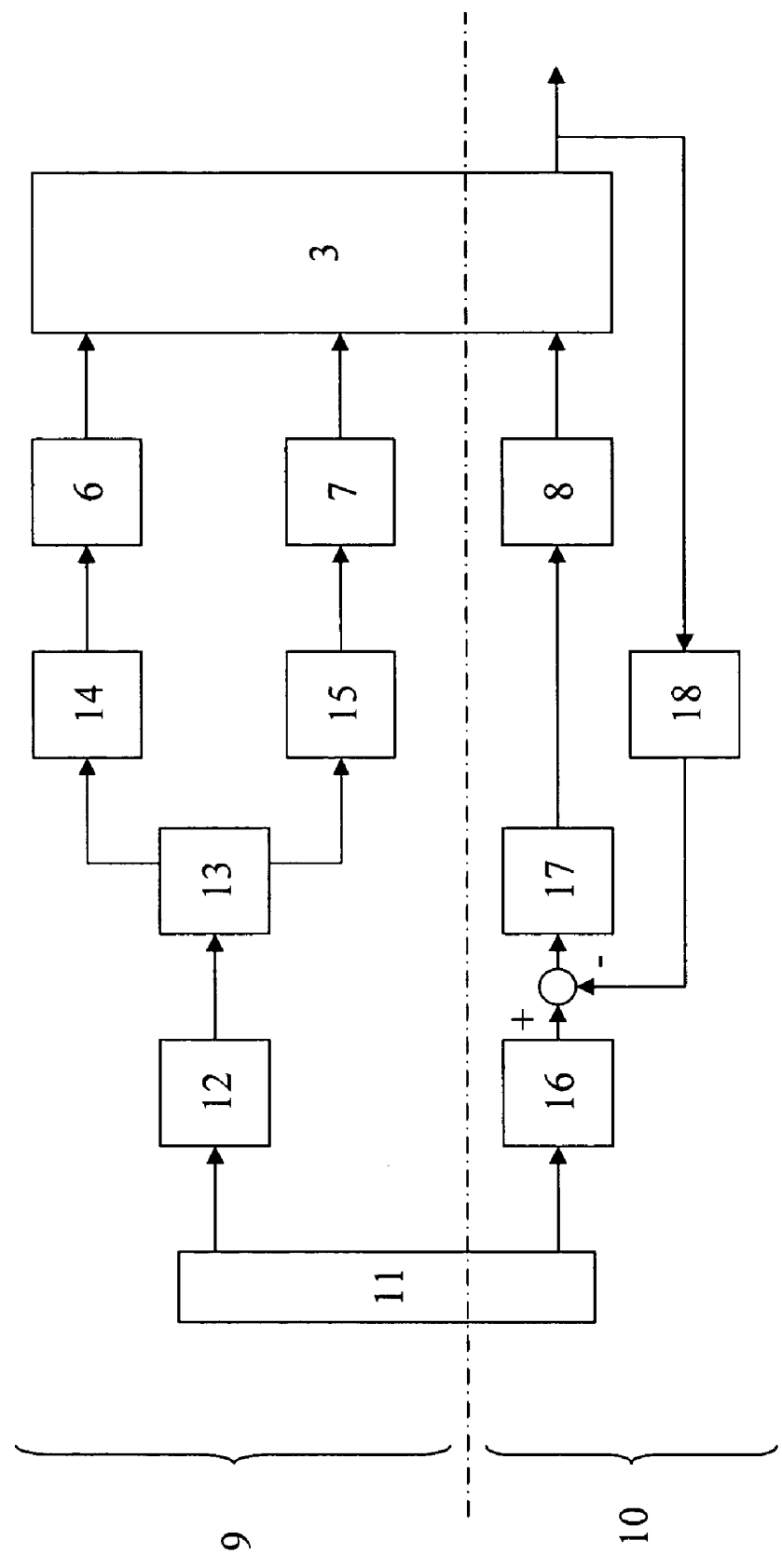
FIG. 3 depicts schematically a control scheme of the positioning system of FIG. 2.

However, it is undesirable to switch motors on and off during the control of the short stroke module 3. FIG. 3 shows a control scheme of the positioning system according to the invention in which the switching on and off of motors of the positioning system is no longer required, while still, the benefits of both types of motors of the first assembly 4 and second motor assembly 5 can be used.

The control scheme of FIG. 3 has a feed-forward part generally indicated with reference numeral 9, and a feedback control part 10. In the feed-forward part 9 of the control scheme, only the first motor assembly 4 including the reluctance motors 6, 7 is actuated. The feed-forward part 9 of the control scheme includes a feed-forward unit 12, which may feed-forward a feed-forward signal to the first motor assembly 4 on the basis of a feed-forward reference signal. The feed-forward reference signal is generated by the reference signal generator 11 and may for instance be a position, speed or acceleration set-point signal, or a combination thereof. The feed-forward unit may be used to perform any feed-forward operation on the feed-forward reference signal, such as multiplying with a feed-forward gain.

The output signal of the feed-forward unit is fed into a splitting unit 13 which is configured to split the output signal of the feed-forward unit in a positive part and a negative part. The positive part is used for a first 6 of the two reluctance motors, while the negative part is used for the other 7 of the reluctance motors. The splitting of the feed-forward signal is desired as the reluctance motors 6, 7 can only be used to actuate the short stroke module 3 in one direction, as was explained above.

Before the positive part and negative part are used to actuate the respective reluctance motor 6, 7, the signals are first fed into a respective linearization unit 14, 15. Linearization of the positive part and negative part of the splitting unit 13 may be desirable as the behaviour of the reluctance motors 6 and 7 may not be linear. The linearity compensation may for example be based on the distance between the long stroke module 2 and the short stroke module 3. In addition, the force generated by the reluctance motors 6, 7 may be quadratically dependent on the current fed through them, which may also make the provision of linearization units 14 an 15 desirable. When the (non)linear behaviour of the reluctance motors 6, 7 is not regarded to be of importance, for instance when the short stroke module 3 is only moved in a very small range, the linearization units 14 and 15 may be omitted.

After linearization of the positive and negative part, the output signal of the linearization units 14, 15 may be led to the reluctance motors 6, 7. In practice, the signal sent to the reluctance motors 6, 7 may have the form of a current, which is generated by an amplifier in response to the signals generated by the linearization units 14, 15. These amplifiers are however not shown in FIG. 3.

In the feedback control part 10 of the control scheme only the second motor assembly 5 including the Lorentz motor 8 is actuated. The feedback control part 10 is fed with a reference signal generated in the reference signal generator 11. This reference signal which preferably is a position set-point signal and preferably does not include an acceleration component is fed to a time lag unit 16. In this time lag unit 16 the signal may be held for a certain time, or in a digital control system for a number of samples, to make the reference signal of the feedback control part 10 lag with respect to the reference signal of the feed-forward part 9. The time lag unit 16 makes it possible to synchronize the signal as fed to the control unit 17 with the movement as achieved by the feed-forward part 9. Any delay in the reaction of the system to the feed-forward part 9 then does not lead to a position error in the feedback loop. If the above-mentioned delay is small enough by itself, the time lag unit 16 may be omitted.

The reference signal leaving the time lag unit 16 will be compared with the actual position of the short stroke module 3 which is measured by a position measurement sensor 18. Such sensor 18 may be any position sensor capable of measuring the position of the short stroke module 3 in the respective degree of freedom and is well-known in the art. The difference between the reference signal and the actual position will be fed to a control unit 17. The control unit 17 will provide a control signal to the Lorentz motor 8 on the basis of the difference between the desired position and the actual measured position of the short stroke module 3. Also, the signal sent to the Lorentz motor 8 may have the form of a current, which is generated by an amplifier (not shown in FIG. 3) in response to the control signal generated by the control unit 17. With the feedback control loop including a relatively accurate Lorentz motor 8, accurate fine positioning of the short stroke module 3 can be obtained. The control unit 17 may be any type of suitable controller known in the art, such as a PI or PID controller.

As the first motor assembly 4 is only actuated in the feed-forward part 9 and the second motor assembly 5 is only actuated in the feedback control part 10, the actuation of the first and second motor assemblies 4, 5 do not interfere with each other. As a result, both the first and second motor assemblies 4 and 5 may continuously be actuated without the first motor assembly disturbing the fine positioning performed in the feedback control part 10 by the second motor assembly 5 and it is not necessary to switch between the motor assemblies to benefit from the typical characteristics of both type of motors.

In the above description the positioning system was described for a single degree in freedom. In practice, a corresponding combination of a first and a second motor assembly including different types of motors may also be applied for one or more further degrees of freedom. For instance a positioning system for the position control of short stroke module 3 of the wafer stage may be applied in both the x-direction and the y-direction.

The positioning system in embodiments of the present invention is in particular suitable for the position control of a movable object which has to be accelerated/decelerated within a very short time and consequently has to be controlled with high accuracy. With the present positioning system, this can be achieved in a short time without having settling phenomena caused by interference between different motor types and without the need to switch one or more of the motor types off during a certain phase of the controlling of the position of the short stroke module 3.

The above-described positioning system is used in the proposed application to actuate the short stroke module to a certain desired position. In practice, the positioning system will also be used to move the short stroke module, or any other movable object, with a certain constant speed, or more generally along a certain position or speed trajectory. In a constant-speed embodiment the feed-forward part 9 of the control scheme may be used to accelerate the short stroke module to a speed close to the desired speed, while the feedback control 10 part keeps the short stroke module at the same speed. The feed-forward reference signal may be a reference acceleration. The position reference signal may be a changing position set-point or a speed set-point and the signal representative for the actual position of the short stroke module may be a position signal of a position sensor or a speed signal of a speed sensor.

Hereinabove, an embodiment of a positioning system is described which is used for the actuation of a short stroke module of a wafer stage. The same positioning system could also be used for any other movable object such as for instance a reticle stage or a part thereof or a wafer stage which is not divided in a short stroke module and a long stroke module.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of positioning a movable object in a first degree of freedom, the method comprising:
providing a first motor assembly comprising one or more motors of a first type and a second motor assembly comprising one or more motors of a second type, each of said first and second motor assemblies configured to move said movable object in said first degree of freedom;
feeding said first motor assembly with a feed-forward signal of a feed-forward unit, the feed-forward signal based on a feed-forward reference signal; and
feeding said second motor assembly with a control signal of a control unit, the control signal based on a difference between a control reference signal and a signal representative of an actual position of said movable object.

2. The method of claim 1, further comprising delaying said position control reference signal with respect to said feed-forward reference signal.

3. The method of claim 1, wherein said first motor assembly comprises a pair of reluctance motors arranged at opposite sides of said movable object, the method further comprising splitting said feed-forward signal in a positive part and a negative part, and feeding said positive part to one of said pair of reluctance motors and said negative part to the other one of said pair of reluctance motors.

4. The method of claim 1, further comprising performing a linearity compensation on said feed-forward signal before feeding said feed-forward signal to said first motor assembly.

5. The method of claim 1, wherein said signal representative of the actual position of said movable object is an actual position signal measured by a position sensor or an actual speed signal measured by a speed sensor.

6. A positioning system configured to control a position of a movable object in at least a first degree of freedom, the system comprising:
a first motor assembly comprising one or motors of a first type configured to move said movable object in said first degree of freedom;
a second motor assembly comprising one or more motors of a second type configured to move said movable object in said first degree of freedom;
a feed-forward unit configured to provide a control signal to said first motor assembly based on a feed-forward reference signal; and
a feedback control unit configured to provide a control signal to said second motor assembly based on a difference between a control reference signal and a signal representative of an actual position of said movable object.

7. The positioning system of claim 6, wherein said first type of motors has relatively high efficiency and low accuracy and said second type of motors has a relatively low efficiency and high accuracy.

8. The positioning system of claim 6, wherein said feedback control unit comprises a time lag unit.

9. The positioning system of claim 6, wherein said first motor assembly comprises a pair of reluctance motors arranged on opposite sides of said movable object.

10. The positioning system of claim 9, wherein said feed-forward unit comprises a splitting unit configured to split said feed-forward signal in a positive part and a negative part, said positive part being fed to one of said pair of reluctance motors and said negative part being fed to the other of said pair of reluctance motors.

11. The positioning system of claim 6, wherein said feed-forward unit comprises one or more linearity compensation units, each of the one or more linearity compensation units associated with a corresponding motor of the first type.

12. The positioning system of claim 6, wherein said positioning system comprises a second combination of a first and second motor assembly to control the position of said movable object in a second degree of freedom.

13. The positioning system of claim 6, wherein said first motor assembly comprises one or more reluctance motor or E-I core actuators.

14. The positioning system of claim 6, wherein said second motor assembly comprises one or more Lorentz motors, voice coil motors, or another type of linear motors.

15. The positioning system of claim 6, wherein said signal representative of the actual position of said movable object is an actual position signal or an actual speed signal.

16. A lithographic apparatus comprising:
(a) an illumination system configured to condition a radiation beam;
(b) a patterning device stage constructed to support a patterning device, the patterning device being capable of imparting the radiation beam with a pattern in its cross-section to form a patterned radiation beam;
(c) a substrate stage constructed to hold a substrate;
(d) a projection system configured to project the patterned radiation beam onto a target portion of the substrate; and
(e) a positioning system configured to control a position of a short stroke module configured to hold one of the substrate or the patterning device in at least a first degree of freedom, the positioning system comprising
(i) a first motor assembly comprising one or motors of a first type configured to move said short stroke module in said first degree of freedom;
(ii) a second motor assembly comprising one or more motors of a second type configured to move said short stroke module in said first degree of freedom;
(iii) a feed-forward unit configured to provide a control signal to said first motor assembly based on a feed-forward reference signal; and
(iv) a feedback control unit configured to provide a control signal to said second motor assembly based on a difference between a control reference signal and a signal representative of an actual position of said short stroke module.

17. A method of positioning a movable object in a first degree of freedom, the method comprising:
moving the movable object in the first degree of freedom with a first motor assembly comprising one or more motors of a first type;

moving the movable object in the first degree of freedom with a second motor assembly comprising one or more motors of a second type;

supplying a feed-forward signal outputted by a feed-forward unit to the first motor assembly, the feed-forward signal being based on a feed-forward reference signal that is inputted to the feedforward unit; and supplying a control signal outputted by a control unit to the second motor assembly, the control signal being based on a difference between a control reference signal and a signal representative of a current position of said movable object.

18. A positioning system configured to position a stage module in a lithographic apparatus, the stage module configured to hold one of a substrate or a patterning device in at least a first degree of freedom, the positioning system comprising (i) a first motor assembly comprising one or motors of a first type configured to move said stage module in said first degree of freedom;

(ii) a second motor assembly comprising one or more motors of a second type configured to move said stage module in said first degree of freedom;

(iii) a feed-forward unit configured to provide a control signal to said first motor assembly based on a feed-forward reference signal; and (iv) a feedback control unit configured to provide a control signal to said second motor assembly based on a difference between a control reference signal and a signal representative of a current position of said stage module.

* * * * *